(12) United States Patent
Chang

(10) Patent No.: US 6,810,500 B1
(45) Date of Patent: Oct. 26, 2004

(54) METHOD FOR MAPPING A TWO-DIMENSIONAL DATA ARRAY IN A MEMORY

(75) Inventor: Ting-Chung Chang, Taipei (TW)

(73) Assignee: Acer Laboratories Inc., Taipei (TW)

( * ) Notice: Subject to any disclaimer, the term of this patent is extended or adjusted under 35 U.S.C. 154(b) by 540 days.

(21) Appl. No.: 09/598,837

(22) Filed: Jun. 21, 2000

(30) Foreign Application Priority Data

Dec. 9, 1999 (TW) .................................. 88121613 A

(51) Int. Cl.[7] .............................................. G11C 29/00
(52) U.S. Cl. ...................... 714/763; 714/702; 348/441; 348/716
(58) Field of Search ................ 714/702, 769, 714/763; 348/441, 716, 718

(56) References Cited

U.S. PATENT DOCUMENTS

| | | | | |
|---|---|---|---|---|
| 3,906,458 A | * | 9/1975 | Ehlers ........................ 711/200 |
| 4,819,236 A | * | 4/1989 | Sako et al. ................. 714/755 |
| 5,623,608 A | * | 4/1997 | Ng .............................. 711/137 |
| 5,781,242 A | * | 7/1998 | Kondo et al. .............. 348/441 |
| 5,798,990 A | * | 8/1998 | Lokhoff et al. ............ 327/323 |
| 5,815,168 A | * | 9/1998 | May ............................ 345/572 |
| 5,864,567 A | * | 1/1999 | Sato et al. ................... 714/755 |
| 5,970,208 A | * | 10/1999 | Shim ........................... 386/126 |
| 6,029,224 A | * | 2/2000 | Asthana et al. ................ 711/5 |
| 6,044,484 A | * | 3/2000 | Chung ......................... 714/766 |
| 6,079,046 A | * | 6/2000 | Tamura et al. .............. 714/781 |
| 6,115,837 A | * | 9/2000 | Nguyen et al. ............. 714/769 |
| 6,125,100 A | * | 9/2000 | Sensyu ..................... 369/275.3 |
| 6,158,038 A | * | 12/2000 | Yamawaki et al. ......... 714/755 |
| 6,158,040 A | * | 12/2000 | Ho .............................. 714/770 |
| 6,167,551 A | * | 12/2000 | Nguyen et al. ............. 714/770 |
| 6,249,854 B1 | * | 6/2001 | Fukuhisa et al. ........... 711/218 |
| 6,252,838 B1 | * | 6/2001 | Kuroda et al. ........... 369/47.28 |
| 6,279,076 B1 | * | 8/2001 | Shishido et al. ............ 711/113 |
| 6,295,596 B1 | * | 9/2001 | Hirabayashi et al. ....... 714/762 |

* cited by examiner

*Primary Examiner*—Albert Decady
*Assistant Examiner*—Guy Lamarre
(74) *Attorney, Agent, or Firm*—Finnegan, Henderson, Farabow, Garrett & Dunner, L.L.P.

(57) ABSTRACT

A memory mapping method for mapping a data array into a memory. The memory mapping method provides the two-directional access in the data array. The memory mapping method first equally divides each row of the data array into some basic units based on the number of the columns of the data array. Next, a predetermined number of adjacent basic units in the same column are arranged into a basic memory block. Finally, the basic memory blocks are mapped into the memory.

10 Claims, 8 Drawing Sheets

| | | | | | | | | | | | |
|---|---|---|---|---|---|---|---|---|---|---|---|
| $B_{0,0}$ | $B_{0,1}$ | ... | $B_{0,63}$ | $B_{0,64}$ | ... | $B_{0,127}$ | $B_{0,128}$ | ... | $B_{0,171}$ | $B_{0,172}$ | ... $B_{0,181}$ |
| $B_{1,0}$ | $B_{1,1}$ | ... | $B_{1,63}$ | $B_{1,64}$ | ... | $B_{1,127}$ | $B_{1,128}$ | ... | $B_{1,171}$ | $B_{1,172}$ | ... $B_{1,181}$ |
| $B_{2,0}$ | $B_{2,1}$ | ... | $B_{2,63}$ | $B_{2,64}$ | ... | $B_{2,127}$ | $B_{2,128}$ | ... | $B_{2,171}$ | $B_{2,172}$ | ... $B_{2,181}$ |
| ⋮ | ⋮ | | ⋮ | ⋮ | | ⋮ | ⋮ | | ⋮ | ⋮ | ⋮ |
| $B_{191,0}$ | $B_{191,1}$ | ... | $B_{191,63}$ | $B_{191,64}$ | ... | $B_{191,127}$ | $B_{191,12}$ | ... | $B_{191,171}$ | $B_{191,172}$ | ... $B_{191,181}$ |
| $B_{192,0}$ | $B_{192,1}$ | ... | $B_{192,63}$ | $B_{192,64}$ | ... | $B_{192,127}$ | $B_{192,12}$ | ... | $B_{192,171}$ | $B_{192,172}$ | ... $B_{192,181}$ |
| ⋮ | ⋮ | | ⋮ | ⋮ | | ⋮ | ⋮ | | ⋮ | ⋮ | ⋮ |
| $B_{207,0}$ | $B_{207,1}$ | ... | $B_{207,63}$ | $B_{207,64}$ | ... | $B_{207,127}$ | $B_{207,12}$ | ... | $B_{207,171}$ | $B_{207,172}$ | ... $B_{207,181}$ |

| | 0 | 1 | ... | 63 | 64 | ... | 127 | 128 | ... | 171 | 172 | ... | 181 | ... |
|---|---|---|---|---|---|---|---|---|---|---|---|---|---|---|
| B$_{0}$ | B$_{0,0}$ (0) | B$_{0,1}$ (0) | ... | B$_{0,63}$ (31) | B$_{0,64}$ (32) | ... | B$_{0,127}$ (63) | B$_{0,128}$ (64) | ... | B$_{0,171}$ (85) | B$_{0,172}$ (86) | ... | B$_{0,181}$ (90) | ...X..X |
| B$_{1}$ | B$_{1,0}$ (96) | B$_{1,1}$ (96) | ... | B$_{1,63}$ (127) | B$_{1,64}$ (128) | ... | B$_{1,127}$ (159) | B$_{1,128}$ (160) | ... | B$_{1,171}$ (181) | B$_{1,172}$ (182) | ... | B$_{1,181}$ (186) | ...X..X |
| : | : | : | | : | : | | : | : | | : | : | | : | ...X..X |
| B$_{5}$ | B$_{5,0}$ (480) | B$_{5,1}$ (480) | ... | B$_{5,63}$ (511) | B$_{5,64}$ (512) | ... | B$_{5,127}$ (543) | B$_{5,128}$ (544) | ... | B$_{5,171}$ (565) | B$_{5,172}$ (566) | ... | B$_{5,181}$ (570) | ...X..X |
| B$_{6}$ | B$_{6,0}$ (576) | B$_{6,1}$ (576) | ... | B$_{6,63}$ (607) | B$_{6,64}$ (608) | ... | B$_{6,127}$ (639) | B$_{6,128}$ (640) | ... | B$_{6,171}$ (661) | B$_{6,172}$ (662) | ... | B$_{6,181}$ (666) | ...X..X |
| : | : | : | | : | : | | : | : | | : | : | | : | ...X..X |
| B$_{191}$ | B$_{191,0}$ (18336) | B$_{191,1}$ (18336) | ... | B$_{191,63}$ (18367) | B$_{191,64}$ (18368) | ... | B$_{191,127}$ (18399) | B$_{191,128}$ (18400) | ... | B$_{191,171}$ (18421) | B$_{191,172}$ (18422) | ... | B$_{191,181}$ (18426) | ...X..X |
| B$_{192}$ | B$_{192,0}$ (18432) | B$_{192,1}$ (18432) | ... | B$_{192,63}$ (18463) | B$_{192,64}$ (18464) | ... | B$_{192,127}$ (18495) | B$_{192,128}$ (18496) | ... | B$_{192,171}$ (18517) | B$_{192,172}$ (18518) | ... | B$_{192,181}$ (18522) | ...X..X |
| : | : | : | | : | : | | : | : | | : | : | | : | ...X..X |
| B$_{207}$ | B$_{207,0}$ | B$_{207,1}$ | ... | B$_{207,63}$ | B$_{207,64}$ | ... | B$_{207,127}$ | B$_{207,128}$ | ... | B$_{207,171}$ | B$_{207,172}$ | ... | B$_{207,181}$ | ...X..X |

FIG.2B (PRIOR ART)

| | | | |
|---|---|---|---|
| $B_{0,0}$ $B_{0,1}$ ... $(U_0)$ $B_{0,63}$ | $B_{0,64}$ $B_{0,65}$ ... $(U_{192})$ $B_{0,127}$ | $B_{0,128}$ $B_{0,129}$ ... $(U_{384})$ $B_{0,181}$ XX...X |
| $B_{1,0}$ $B_{1,1}$ ... $(U_1)$ $B_{1,63}$ | $B_{1,64}$ $B_{1,65}$ ... $(U_{193})$ $B_{1,127}$ | $B_{1,128}$ $B_{1,129}$ ... $(U_{385})$ $B_{1,181}$ XX...X |
| $B_{2,0}$ $B_{2,1}$ ... $(U_2)$ $B_{2,63}$ | $B_{2,64}$ $B_{2,65}$ ... $(U_{194})$ $B_{2,127}$ | $B_{2,128}$ $B_{2,129}$ ... $(U_{386})$ $B_{2,181}$ XX...X |
| ... | ... | ... |
| $B_{191,0}$ $B_{191,1}$ ... $(U_{191})$ $B_{191,63}$ | $B_{191,64}$ $B_{191,65}$ ... $(U_{383})$ $B_{191,127}$ | $B_{191,128}$ $B_{191,129}$ ... $(U_{575})$ $B_{191,181}$ XX...X |
| $B_{192,0}$ $B_{192,1}$ ... $(U_{576})$ $B_{192,63}$ | $B_{192,64}$ $B_{192,65}$ ... $(U_{592})$ $B_{192,127}$ | $B_{192,128}$ $B_{192,129}$ ... $(U_{608})$ $B_{192,181}$ XX...X |
| ... | ... | ... |
| $B_{207,0}$ $B_{207,1}$ ... $(U_{591})$ $B_{207,63}$ | $B_{207,64}$ $B_{207,65}$ ... $(U_{607})$ $B_{207,127}$ | $B_{207,128}$ $B_{207,129}$ ... $(U_{623})$ $B_{207,181}$ XX...X |

FIG.3

| G0 (0) | G1 (256) | G2 (512) | G3 (768) | G4 (1024) | G5 (1280) |
| G6 (1536) | G7 (1792) | G8 (2048) | G9 (2304) | G10 (2560) | G11 (2816) |
| G12 (3072) | G13 (3328) | G14 (3584) | G15 (3840) | G16 (4096) | G17 (4352) |
| G18 (4608) | G19 (4864) | G20 (5120) | G21 (5376) | G22 (5632) | G23 (5888) |
| G24 (6144) | G25 (6400) | G26 (6656) | G27 (6912) | G28 (7168) | G29 (7424) |
| G30 (7680) | G31 (7936) | G32 (8192) | G33 (8448) | G34 (8704) | G35 (8960) |
| G36 (9216) | G37 (9472) | G38 (9728) | G39 (9984) | G40 (10240) | G41 (10496) |
| G42 (10752) | G43 (11008) | G44 (11264) | G45 (11520) | G46 (11776) | G47 (12032) |
| G48 (12288) | G49 (12544) | G50 (12800) | G51 (13056) | G52 (13312) | G53 (13568) |
| G54 (13824) | G55 (14080) | G56 (14336) | G57 (14592) | G58 (14848) | G59 (15104) |
| G60 (15360) | G61 (15616) | G62 (15872) | G63 (16128) | G64 (16384) | G65 (16640) |
| G66 (16896) | G67 (17152) | G68 (17408) | G69 (17664) | G70 (17920) | G71 (18176) |
| G72 (18432) | G73 (18688) | G74 (18944) | G75 (19200) | G76 (19456) | G77 (19712) |

FIG.4

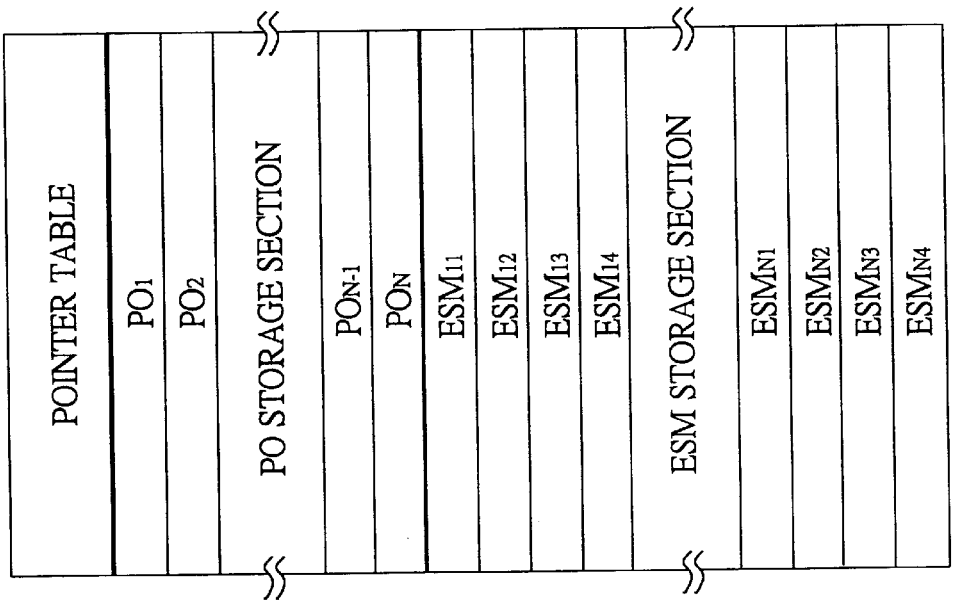

METHOD FOR MAPPING A TWO-DIMENSIONAL DATA ARRAY IN A MEMORY

BACKGROUND OF THE INVENTION

This application incorporates by reference Taiwanese application Serial No. 88121613, filed on Dec. 9, 1999.

1. Field of the Invention

The invention relates in general to a memory mapping method and more particularly to a memory mapping method for mapping a data array into a memory.

2. Description of the Related Art

As the computer sciences improve, people demand more from modern devices. The processing rate performed by the computer also increases faster and faster. Therefore, people demand more from recording media such as digital versatile disk (DVD), floppy disk, compact disk (CD), hard disk . . . etc. The DVD, with its high storage capacity, is expected to be the focus of the future.

In the personal computer (PC), the data stored in the DVD is read out and decoded by the DVD-ROM (read only memory) player. The decoded data is then received and processed by a host machine, for example, a personal computer. FIG. 1 shows a block diagram for the conventional DVD-ROM player. As shown in FIG. 1, an optical reading head 102 reads data from a DVD 101. The optical reading head 102 is a mechanically operated optical device. The output from the optical reading head 102, in analog form, is received by a radio frequency (RF) amplifier 103. The output from the RF amplifier 103 is then received by an ESM (Eight to Sixteen Modulation) demodulator 104. The ESM demodulator 104 receives the output from the RF amplifier 103, and performs an ESM demodulation on the received data. The ESM demodulator 104 then writes the demodulated data into a DRAM (Dynamic Random Access Memory) 105 which uses an ECC (Error Correction Code) block as a storage unit. Accordingly, the DRAM 105 includes a number of ECC blocks.

The data structure for the ECC block is shown as FIG. 2A. An ECC block, considered as a data array, is defined as 208 rows by 182 columns. The rows from top to bottom are respectively defined as row 0, row 1, . . . row 192, . . . and row 207. The columns from left to right are respectively defined as column 0, column 1, . . . column 172, . . . column 181. In the ECC block the storage unit is a byte and "$B_{m,n}$" represents data stored in the junction of the m-th row and n-th column. The outer-code parity (PO) data is stored in the last 16 rows, i.e., rows 192~207. Accordingly, the last 16 rows are defined as PO rows while rows 0~91 are defined as the data rows. The inner-code parity (PI) data is stored in the last 10 columns, i.e., columns 172~181, and are defined as PI columns.

The sequence in writing the demodulated data into the ECC block is row 0, row (1, . . . row 11, row 192), (row 12, . . . row 22, row 193), row 24, . . . row 34, row 194, etc. To sum up, the writing steps are: (a) sequentially writing data into adjacent 11 rows of the data row; (b) writing data into one row of the PO row; and (c) repeating (a) and (b) until all data are completely written.

An ECC unit 106 then reads out data from the related ECC block of the DRAM 105 and performs an ECC decoding on the data from the ECC block. ECC decoding is a well-known technique to those who are skilled in the art, therefore the details thereof are not repeated again. The ECC unit 106 reads data twice from the ECC block. The ECC unit 106 first reads data in row direction (PI direction) of the ECC block followed by the column direction (PO direction). In row direction, the reading is performed sequentially from row 0 to row 207. The ECC unit 106 performs ECC by the PI bytes of these rows. In column direction, the reading is performed sequentially from column 0 to column 181. The ECC unit 106 performs ECC by the PO bytes of these columns. If errors are detected during the ECC operation by the ECC unit 106, the ECC unit 106 corrects the errors and writes the corrected data into the related ECC block. Since the ECC unit 106 reads data from and writes data into the DRAM 105, there is signal handshake between the ECC unit 106 and the DRAM 105.

If the ECC unit 106 does not find any error in both row and column directions, an EDC (Error Detection Code) unit 107 does not need to perform error detection on the data. If any erroneous data is found, the ECC unit 106 performs an error-correction operation on the error. Once the ECC unit 106 corrects the erroneous data, the EDC unit 107 reads the related data from the DRAM 105 for EDC check. However, during the EDC check, the PO bytes are not needed and so the EDC unit 107 does not read rows 192~207 of the related ECC block from the DRAM 105. In other words, the reading sequence is row 0~191 during the EDC check. Since the EDC reads data from the DRAM 105, there is signal handshake between the EDC unit 107 and the DRAM 105.

After the EDC unit 107 performs the EDC check, the output from the EDC unit 107 is received by an ATAPI (AT Attachment Packet Interface) 108 which then transmits the data into a PC 109. This completes the data transfer from the DVD 101 to the PC 109. If the ESM demodulator 104 writes data into the DRAM 105 in linear address mapping, the result is shown as FIG. 2B. In FIG. 2B, numbers below each byte represent the address for the related byte. For example, the address for $B_{0,0}$ is 0, and the address for $B_{1,0}$ is 96. In DRAM 105, a storage unit for an address is a word, and a word consists of two bytes. In FIG. 2B, there are two bytes stored in one address. For example, $B_{0,0}$ and $B_{0,1}$ are both stored in address 0. The addresses are arranged from left to right, and from top to bottom. The last ten bytes in each column, marked by "X", represent the dummy data. The dummy data is used to facilitate the accessing speed. Of course, these dummy data are ignored properly, and the data needed is not affected.

The advantage of the linear address mapping is one of easy implementation. However, linear address mapping is only useful in the access of one-dimensional data or in the single direction access of the two-dimensional data arrays. The single direction access means that the access direction is either row direction or column direction. When two-dimensional data arrays need to be accessed in two directions (both row direction and column direction), the performance of the linear address mapping is less then ideal in terms of efficienty.

When linear address mapping is used in two-directional access of two-dimensional data arrays, it often results in a number of pages missing. In a memory, the number of addresses in one page is fixed, for example, 512. When data accessed at the same time are not at the same page, page missing occurs. Page missing reduces the efficiency of data access.

The ECC block in FIG. 2B is taken for example. It is supposed that ECC unit 106 accesses 8 words (16 bytes) from the DRAM 105 at one time. As stated above, the ECC unit 106 reads data twice from the ECC block, one in row direction and the other in column direction. When the ECC unit 106 reads data in row direction, the data read by the ECC unit are always at the same page. In other words, no page missing occurs in row direction access. However, when the ECC unit 106 reads data in column direction, the data read by the ECC unit are not at the same page. In other words, page missing occurs during column direction access.

The data accessed in the first time of column direction access includes $(B_{0,0}, B_{0,1})$, $(B_{1,0}, B_{1,1})$, $(B_{2,0}, B_{2,1})$, $(B_{3,0}, B_{3,1})$, $(B_{4,0}, B_{4,1})$, $(B_{5,0}, B_{5,1})$, $(B_{6,0}, B_{6,1})$ and $(B_{7,0}, B_{7,1})$. Referring to FIG. 2B, in column direction access, eight bytes in each of two adjacent columns are accessed at the same time. As shown in FIG. 2B, the addresses for the first six pairs of bytes are limited within 0~511 while the addresses for $(B_{6,0}, B_{6,1})$ and $(B_{7,0}, B_{7,1})$ are limited within 512~1023. In other words, the first six pairs of bytes are on the same page while the last two pairs of bytes are not on the same page as the first six pairs of bytes. Thus, page missing occurs during first time access in the column direction. Similarly, it is known that one page missing occurs during each access in the column direction. When page missing occurs, the access period becomes longer, resulting in reduced access efficiency.

The second disadvantage of the linear address mapping relates to increased hardware cost. When the linear address mapping is applied in two-directional access, page missing occurs randomly. Therefore, extra circuitry for detecting page missing is required which translates to increased hardware cost.

SUMMARY OF THE INVENTION

It is therefore an object of the invention to provide an improved and simplified method of memory mapping used in two-directional access. By the invention, page missing is prevented in two-directional access, resulting in increasing the access rate. In addition, the circuit complexity is reduced.

The invention achieves the above-identified objects by providing a new memory mapping method for two-directional access in two-dimensional data array. The memory mapping method maps a first data array into a second data array for storing into a memory. The first data array contains m rows by n columns. The memory mapping method includes the steps of: (a) dividing each row of the first data array equally into k basic units, wherein n/k is a multiple of 2j, and each basic unit includes n/k bytes; (b) arranging adjacent j basic units in each column of the first data array into a basic memory block in a row manner, wherein each basic memory block includes n*j/k bytes; and (c) arranging the basic memory block in the form of the second data array for storing in the memory; wherein j is the number of words in each row-directional access and column-directional access.

Further, a data structure to store ECC (error correction code) blocks in a memory is provided by the invention. Each ECC block includes access data, outer-code parity (PO) data, and inner-code parity (PI) data. In addition, each ECC block is divided into a PO unit containing the PO data and a number of ESM (eight-to-sixteen modulation) units containing the access data and the PI data. The data structure includes a storage section, which includes PO units of each ECC block. The data structure further includes another storage section, which includes ESM units of each ECC block and a pointer table, which includes a number of pointers that point to the related address of the PO units and the ESM units in the memory.

Still further, the invention provides a memory mapping method for two-directional access in two-dimensional data array. The memory mapping method maps the first data array into the second data array to store into a memory. The first data array includes m rows by n columns. The first data array is obtained by adding a number of dummy data into each row of an ECC (error correction code) block. The memory mapping method includes the following steps. Firstly, each row of the first data array is divided equally into k basic units, wherein n/k is a multiplier multiple of 2j, and each basic unit includes n/k bytes. Secondly, adjacent j basic units in each column of the first data array are arranged into a basic memory block in a row manner, wherein each basic memory block contains n*j/k bytes. Next the basic memory block in the form of the second data array are arranged to store in the memory; wherein j is the number of words in each row-directional access and column-directional access.

BRIEF DESCRIPTION OF THE DRAWINGS

Other objects, features, and advantages of the invention will become apparent from the following detailed description of the preferred but non-limiting embodiments. The description is made with reference to the accompanying drawings, in which:

FIG. 2A is a data structure of a conventional ECC block;

FIG. 2B is a data structure of an ECC block mapped by the linear address mapping;

FIG. 3 shows how an ECC block is divided according to the invention;

FIG. 4 shows the result of memory allocation of a mapping method for mapping the basic memory blocks of an ECC block into the ECC block of the memory;

FIG. 7A shows a data structure of an ESM unit of the invention;

FIG. 7B shows a data structure of a PO unit of the invention; and

FIG. 7C shows a data structure of the memory allocation of the invention.

DESCRIPTION OF THE PREFERRED EMBODIMENT

The following statement describes how a data array is mapped into the memory according to the preferred embodiment of the invention. For example, by applying the method described in the preferred embodiment in the memory mapping of DVD, the ECC block of data array mapped into memory to facilitate the DVD decoding rate.

Here, it is supposed that the data array is m rows by n columns. The memory mapping method of the invention includes the steps as follows. Firstly, each row of the data array is equally divided into k basic units. The result of n/k bytes is a multiple of 2j, wherein j is the number of word per memory access, for example, 8 words, and 2j is the number of bytes per memory access, for example, 16 byes. The successive j basic units in one column are then combined into a basic memory block. After that, these basic memory blocks are mapped into memory by a proper mapping method.

The ECC block in FIG. 2A is to be mapped into the memory by the memory mapping method according to the invention. Ten dummy data are added to each row of this ECC block to facilitate the access procedure which translates to m=208 and n=192. Now, referring to FIG. 3, k is chosen as 3. So, n/k=192/3=64, wherein 64 is a multiple of 2*j=2*8=16.

As shown in FIG. 3, in the case of k=3, the first row (row 0) is divided into three basic units $U_0$, $U_{192}$ and $U_{384}$, wherein $U_0=(B_{0,0}, B_{0,1}, \ldots B_{0,63})$, $U_{192}=(B_{0,64}, B_{0,65}, \ldots B_{0,127})$ and $U_{384}=(B_{0,128}, \ldots B_{0,181}, X,X,X,X,X,X,X,X,X)$. Similarly, the second row (row 1) is divided into three basic units $U_1$, $U_{193}$ and $U_{385}$, wherein $U_1=(B_{1,0}, B_{1,1}, \ldots B_{1,63})$, $U_{193}=(B_{1,64}, B_{1,65}, \ldots B_{1,127})$ and $U_{385}=(B_{1,128}, \ldots B_{1,181},X,X,X,X,X,X,X,X,X,)$. The other rows are divided similarly. Each basic unit includes 64 bytes. The ECC block contains 624 basic units, these basic units are marked by $U_L$, wherein L=0, 1, 2, ... 623.

The basic memory block is then defined. Here, successive 8(j) basic units in the same column are combined into a basic memory block G. Thus; one ECC block contains 78 basic memory blocks. The combination rule is $G_I=(U_{8I}, U_{8I+1}, U_{8I+2}, U_{8I+3}, U_{8I+4}, U_{8I+5}, U_{8I+6}, U_{8I+7})$, wherein I=0~77. For example, $G_0=(U_0, U_1, U_2, U_3, U_4, U_5, U_6, U_7)$. If one page consists of 512 words, one page contains two basic memory blocks. All bytes in the same basic memory block are on the same page. In other words, page missing is reduced when the basic memory blocks are accessed in row direction or column direction.

Figure 1:
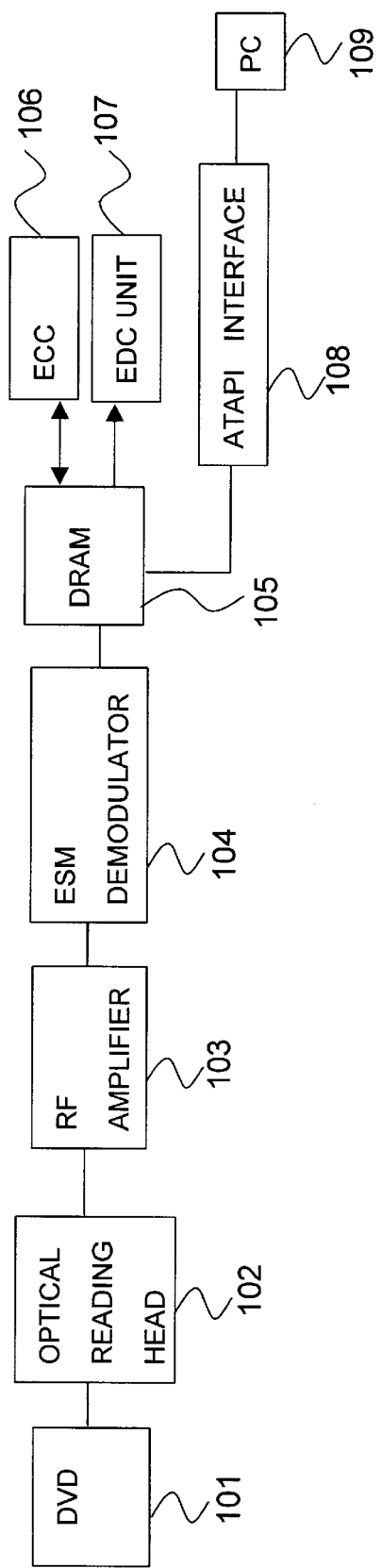
FIG. 1 is a block diagram of conventional DVD-ROM player.

The basic memory blocks are then mapped into the ECC block of the memory (the DRAM 105 in FIG. 1). FIG. 4 shows the result of a mapping method of the basic memory blocks into the memory, wherein the address of each basic memory block being massed in the memory is encircled in braces. Each row contains 6 basic memory blocks and each basic memory block contains 512 bytes. Therefore, a row contains 3K bytes. Other mapping methods may also be applied in the mapping of the basic memory blocks into the memory. Regardless of the mapping method, the basic memory blocks are properly mapped into memory.

FIGS. 3 and 4 explain the data access in row and column directions. In two-directional access, the access sequence is shown as FIG. 3, but the real access location is determined from FIG. 4.

Firstly, data are accessed in row direction. As shown in FIG. 3, in row direction, the bytes $(B_{0,0}, B_{0,1}, \ldots B_{0,15},)$, $(B_{0,16}, B_{0,17}, \ldots B_{0,31},)$, $(B_{0,32}, B_{0,33}, \ldots B_{0,47})$ and $(B_{0,48}, B_{0,49}, \ldots B_{0,63})$ are respectively accessed in the first four accesses. The bytes accessed in the first four accesses are all in the basic unit $U_0$, and the basic unit $U_0$ is in the basic memory block $G_0$. As stated above, the bytes in the same basic memory block are on the same page. There is no page missing in the first four accesses in row direction. The bytes are respectively accessed in the fifth to eighth accesses. The bytes accessed in the fifth to eighth accesses are all in the basic unit $U_{192}$, which is in the basic memory block $G_{24}$. Similarly, in each access in the row direction, the bytes accessed are all in the same basic memory block and, accordingly, on the same page. In other words, by applying the memory mapping method of the invention, no page missing occurs during row direction access.

Access in column direction is then described. In the first access of column direction, the bytes accessed are $(B_{0,0}, B_{0,1})$, $(B_{1,0}, B_{1,1})$, $(B_{2,0}, B_{2,1})$, $(B_{3,0}, B_{3,1})$, $(B_{4,0}, B_{4,1})$, $(B_{5,0},B_{5,1})$, $(B_{6,0}, B_{6,0}, B_{6,1})$ and $(B_{7,0}, B_{7,1})$. As shown in FIG. 3, the bytes accessed in the first access of column direction are respectively in $U_0$~$U_7$, which are all in $G_0$. No page missing occurs in the first access of column direction. Similarly, the bytes accessed in each subsequent access of column direction are all in the same basic memory block and, accordingly, on the same page. Therefore, by applying the memory mapping method of the invention, no page missing occurs during column direction access.

To sum up, according to the method of the invention, the bytes accessed in each two-directional access are all in the same basic memory block and, accordingly, on the same page. Thus, no page missing occurs in the two-directional access of the memory made of the basic memory blocks.

The access interval between the invention and the linear address mapping is compared below to demonstrate the improvement afforded by the invention.

Figures 5A, 5B:
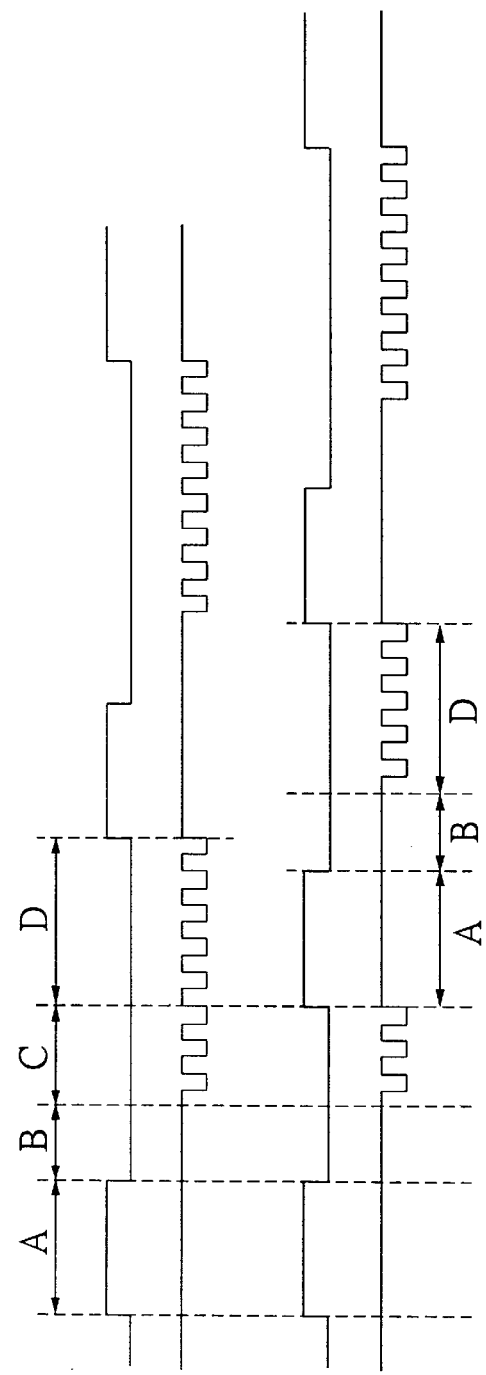
FIG. 5A shows a time interval for accessing 8 words without page missing.
FIG. 5B shows a time interval for accessing 8 words with page missing.

FIG. 5A shows the interval for accessing 8 words without page missing.

The intervals "A" and "B" are preparation intervals for accessing words such as pre-charge interval. Interval "C" is the interval for accessing 3 words while the interval "D" is the interval for accessing 5 words. As shown in FIG. 5A, the total time taken in accessing 8 words without page missing is (A+B+C+D).

FIG. 5B shows the interval for accessing 8 words with a page missing. The intervals "A", "B", "C" and "D" are the same as that in FIG. 5A. As shown in FIG. 5B, the total time taken in accessing 8 words with a page missing is (A+B+C+A+B+D). In FIG. 5B, page missing occurs when the fourth word is accessed. By properly adjusting FIG. 5B, it can be used to demonstrate the occurrence of page missing when other words are accessed. By comparing FIGS. 5A and 5B, if page missing occurs, the access interval is increased by (A+B).

Given the above, the time taken to access an ECC block based on the linear address mapping can be calculated. As stated above, an ECC block is accessed twice, once in row direction and the other in column direction. It is supposed that 8 words are accessed in one access.

Firstly, the time taken on accessing an ECC block in row direction is calculated. Each row contains 192 bytes=96 words and requires 12 (96/8=12) times to completely access a row. In row direction access based on the linear address mapping, no page missing occurs. It takes (A+B+C+D) for each access, which translates to 12*(A+B+C+D) to access a row. An ECC block contains 208 rows. Thus, it takes 208*12*(A+B+C+D)=2496*(A+B+C+D) to completely access all rows of an ECC block.

In column direction, an ECC block contains 182 columns (the dummy data is not necessary). As mentioned above, two adjacent columns are accessed together, thus, it takes 182/2=91 times for accessing 182 columns. Each column contains 208 bytes, which means that it takes 208/8=26 times for accessing all bytes of one column. Therefore, in column direction, it takes 91*26=2366 times for completely accessing an ECC block. However, page missing occurs in each access of column direction. When a page missing occurs, it takes (A+B+C+A+B+D) to access 8 words. Therefore, in column direction, it takes 2366*(A+B+C+A+B+D)=2366*(A+B+C+D)+2366*(A+B) to complete column direction access of an ECC block.

As a result, it takes 2496*(A+B+C+D)+2366*(A+B+C+D)+2366*(A+B)=4862*(A+B+C+D)+2366*(A+B) for the complete accessing of an ECC block in two directions using linear address mapping.

A calculation of access time required is based on the invention is presented below.

In row direction, it takes 2496*(A+B+C+D) to complete access in the invention. That is because there is no page missing during row direction access.

In column direction, there are 2366 accesses for an ECC block in the invention. Since no page missing occurs during each column direction access, it takes 2366*(A+B+C+D) to complete column direction access. As a result, it takes only 2496*(A+B+C+D)+2366*(A+B+C+D)=4862*(A+B+C+D) to complete two-directional access on one ECC block in the invention.

Taking the EDO-35 DRAM for example. It is supposed that the reference clock of the DRAM is 66 MHz. It is known that A=2.5T, B=1.5T, C=3T and D=5T, wherein T=1/66=15.15 ns. In linear address mapping, it takes 4862*(A+B+C+D)+2366*(A+B)=58344T+9464T=67808T to complete two-directional access on one ECC block. In the invention, it takes 4862*(A+B+C+D)=58344T to complete two-directional access on one ECC block. In other words, the invention represents an improvement of (67808T−58344T)/67808T=13.957% as compared to the traditional linear address mapping.

Figure 6:
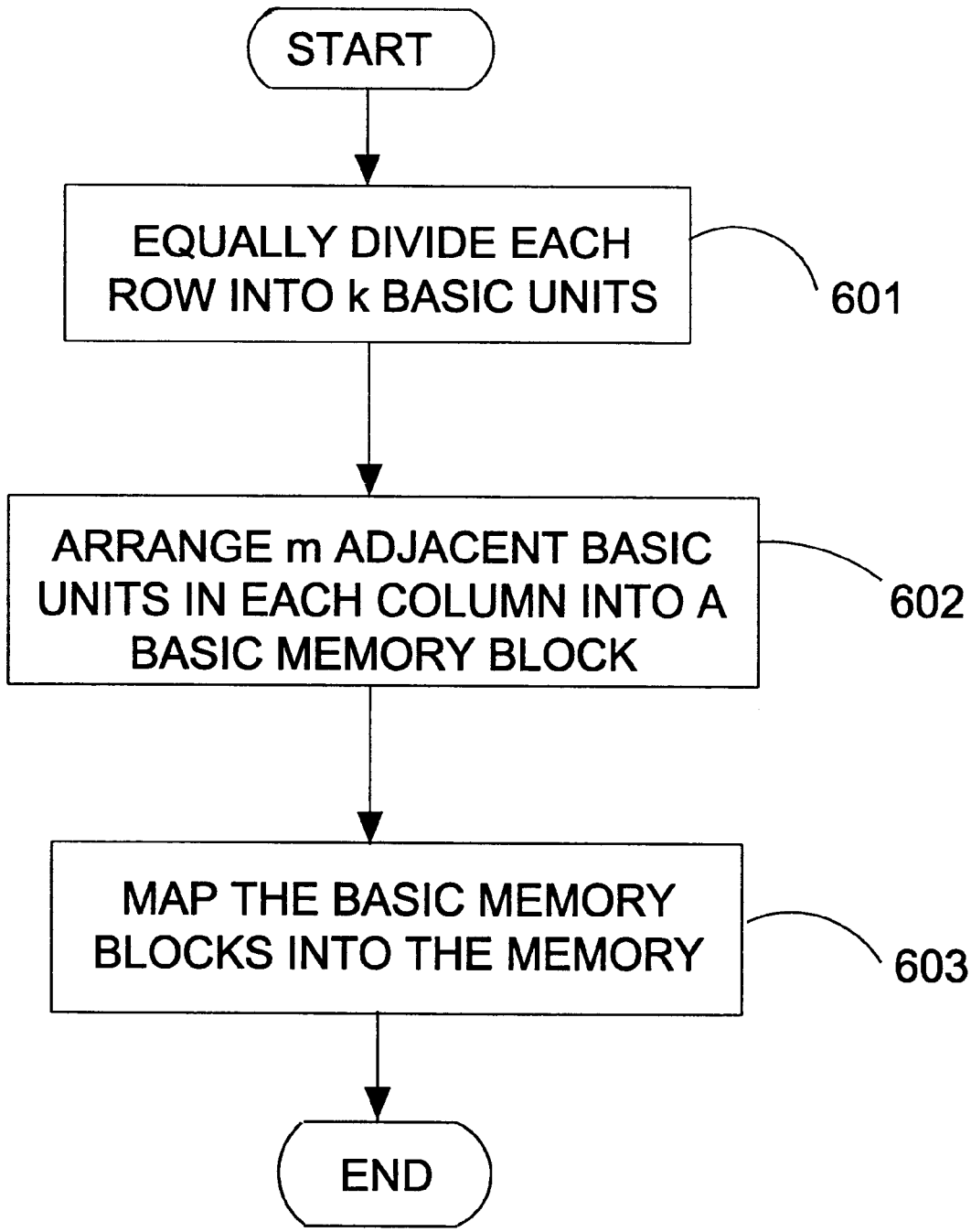
FIG. 6 shows the flowchart of the memory mapping of the invention.

Now, referring to FIG. 6, a flow chart of the memory mapping method of the invention is shown. The memory mapping method shown in FIG. 6 is applied in mapping a data array into a memory. In the following description, the data array contains 208 rows by 192 columns. Therefore, in the case of the ECC block in the DVD-ROM player, 10 bytes of dummy data are added to each row of the ECC block.

Firstly, each row is equally divided into k basic units, as shown in the step 601. In the ECC block, each row is equally divided into 3 basic units $U_L$, i.e., k=3. In other words, there are 624 basic units in the ECC block.

Next, m adjacent basic units in each column are arranged into a basic memory block, as shown in the step 602. In the ECC block, 8 adjacent basic units in each column are arranged into a basic memory block $G_I$, i.e., m=8. In other words, there are 78 basic memory blocks in the ECC block.

Finally, these basic memory blocks are mapped into the memory, as shown in step 603. In the case of ECC block, the mapping is not limited by FIG. 4, as long as a basic memory block is taken as a unit of mapping.

Furthermore, a data structure is provided by the invention. The following description states the data structure by applying the DRAM and the ECC block.

As described above, there are 208 rows (row 0~row 207) in one ECC block. In one ECC block, row 0~row 191 are equally divided into four data sections, and row 192~row 207 are defined as one PO unit. Thus, each ECC block contains four data sections and one PO unit. In addition, the data section is also defined as one ESM (eight-to-sixteen modulation) unit. The ESM unit and the PO unit are shown in FIGS. 7A and 7B. For convenience, the four ESM units are respectively named as first ESM unit, second ESM unit, third ESM unit and fourth ESM unit.

FIG. 7A shows a structure of the first ESM unit wherein the symbol (j) represents the $U_j$ in FIG. 3. As shown in FIG. 7A, one ESM unit includes 16*9=144 basic units, and accordingly 144*64=9K bytes. From FIG. 3 and FIG. 7A, it is known that the first ESM unit contains row 0~row 47. Similarly, the other three ESM units contain row 48~95, row 96~143, and row 144~191 respectively.

FIG. 7B shows the structure of one PO unit. One PO unit contains all PO codes of one ECC block. In other words, the PO unit contains row 192~row 207 and, accordingly, 48 basic units. There are 48*64=3K bytes in the PO unit.

Referring to FIG. 7C, it shows a data structure of the memory wherein the memory is, for example, the DRAM 105 in FIG. 1. As shown in FIG. 7C, the data structure contains a pointer table, a PO storage section, and an ESM storage section. The pointer table contains a number of pointers. It is supposed that there are N ECC blocks in the memory, and all ECC blocks are sequentially marked from 1 to N. The PO storage section contains PO units of all ECC blocks. In the PO storage section, the PO units, $PO_1$, $PO_2$ . . . $PO_N$ are sequentially stored from top to bottom, wherein $PO_J$ represents the PO unit of J-th ECC block (J=1~N). Similarly, the ESM storage section contains ESM units of all ECC blocks. In the ESM storage section, four ESM units of the same ECC block are stored adjacently. In other words, the ESM units, $ESM_{11}$, $ESM_{12}$, $ESM_{13}$, $ESM_{14}$, . . . $ESM_{N1}$, $ESM_{N2}$, $ESM_{N3}$ and $ESM_{N4}$ are sequentially stored from top to bottom, wherein $ESM_{JK}$ represents the K-th ESM unit of the J-th ECC block (K=1~4, J=1~N).

The pointers in the pointer table are used to point to the PO and ESM units of these ECC blocks. That is to say, in the data structure, the ECC block is pointed through the pointers.

One characteristic of the invention relates to equally dividing each row of the ECC block into some basic units, and then combining a predetermined number of adjacent basic units in the same column into a basic memory block. These basic memory blocks are considered as mapping units when mapped into the memory. In two-directional access, page missing is prevented by the invention. Therefore, the access rate is improved and the circuit complexity is reduced. In addition, the invention is suitable for mapping data arrays into the memory.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for mapping a two-dimensional data array in a memory, said method mapping a first data array into a second data array for storing into a memory, said first data array containing m row by n columns, said method comprising the steps of:

dividing each row of said first data array equally into k basic units, wherein n/k is a multiple of 2j and j is the number of words in each row-directional access and column-directional access, and each basic unit comprises n/k bytes;

arranging adjacent j basic units in each column of said first data array into a basic memory block in a row manner, wherein each basic memory block comprises n*j/k bytes; and arranging said basic memory block in the form that all the bytes in the same memory block are on the same page and thereby form said second data array for storing in said memory.

2. A memory mapping method according to claim 1, wherein said first data array comprises 208 rows by 192 columns.

3. A memory mapping method according to claim 2, wherein said first data array comprises 624 basic units when k=3.

4. A memory mapping method according to claim 3, wherein said first data array comprises 78 basic memory blocks when j=8.

5. A memory mapping method according to claim 1, wherein said memory is a DRAM (dynamic random access memory) in a DVD player, and said DRAM comprises a plurality of ECC (error correction code) blocks.

6. A memory mapping method according to claim 5, wherein said first data array is made by adding 10 bytes of dummy data in each row of each ECC block.

7. A method for mapping a in two-dimensional data array in a memory, said method mapping a first data array into a second data array and storing said second data array into a memory, wherein said first data array comprises m rows by n columns, said first data array is made by adding a plurality of dummy data into each row of an ECC (error correction code) block, said method comprising the steps of:

dividing each row of said first data array equally into k basic units, wherein n/k is a multiple of 2j and j is the number of words in each row-directional access and column-directional access, and each basic unit comprises n/k bytes;

arranging adjacent j basic units in each column of said first data array into a basic memory block in a row manner, wherein each basic memory block comprises n*j/k bytes; and arranging said basic memory blocks in the form that all the bytes in the same memory block are on the same page and thereby form said second data array for storing in said memory.

8. A memory mapping method according to claim 7, wherein said ECC block comprises 208 rows by 182 columns.

9. A memory mapping method according to claim 8, wherein the last 10 bytes in each row of the ECC block are defined as inner-code parity (PI), and the last 16 bytes in each column of the ECC block are defined as outer-code parity (PO).

10. A memory mapping method according to claim 8, wherein said first data array is made by adding 10 bytes of dummy data into each row of said ECC block.

* * * * *